United States Patent
Anderson et al.

(10) Patent No.: US 8,519,674 B2
(45) Date of Patent: Aug. 27, 2013

(54) METHOD FOR ESTIMATING BATTERY DEGRADATION IN A VEHICLE BATTERY PACK

(75) Inventors: Alastair Gordon Anderson, Wiesbaden (DE); Remy Fontaine, Wiesbaden (DE); Sebastian Lienkamp, Budenheim (DE); Stephen Raiser, Wiesbaden (DE); Peter Kilian, Heidelberg (DE)

(73) Assignee: GM Global Technology Operations LLC, Detroit, MI (US)

( * ) Notice: Subject to any disclaimer, the term of this patent is extended or adjusted under 35 U.S.C. 154(b) by 602 days.

(21) Appl. No.: 12/617,050

(22) Filed: Nov. 12, 2009

(65) Prior Publication Data

US 2011/0112781 A1 May 12, 2011

(51) Int. Cl.
*H02J 7/00* (2006.01)

(52) U.S. Cl.
USPC ............. 320/132; 702/57; 702/63; 320/127

(58) Field of Classification Search
USPC .............................................. 702/60, 63–64
See application file for complete search history.

(56) References Cited

U.S. PATENT DOCUMENTS

| | | | |
|---|---|---|---|
| 6,336,063 B1* | 1/2002 | Lennevi | 701/22 |
| 6,453,249 B1* | 9/2002 | Shibutani et al. | 702/63 |
| 6,836,122 B2* | 12/2004 | Tojima | 324/426 |
| 7,324,902 B2* | 1/2008 | Verbrugge et al. | 702/64 |
| 2003/0184307 A1* | 10/2003 | Kozlowski et al. | 324/427 |
| 2009/0146664 A1* | 6/2009 | Zhang | 324/433 |

OTHER PUBLICATIONS

V. Coroban, I. Boldea and F. Blaabjerg, "A Novel On-line State-of-Charge Estimation Algorithm for Valve Regulated Lead-Acid Batteries used in Hybrid Electric Vehicles", 2007, IEEE, 1-4244-0891-1/07, pp. 1-8.*

Pop et al., "State-of-the-art of battery state-of-charge determination", Oct. 31, 2005, Institute of Physics Publishing, Measurement Science and Technology 16, pp. R93-R110, 0957-0233/05/120093+18, doi:10.1088/0957-0233/16/12/R01.*

Miller, Gene H., "Microcomputer Engineering", 1999, Prentice-Hall Inc., Second Edition, pp. 203-204, ISBN 0-13-895368-6.*

\* cited by examiner

*Primary Examiner* — Mischita Henson
(74) *Attorney, Agent, or Firm* — Lionel D. Anderson; Reising Ethington P.C.

(57) ABSTRACT

A method for gathering information from battery sensors—for instance, information regarding the state-of-charge (SOC), temperature and/or other characteristics of battery cells in a vehicle battery pack—and using that information to estimate or predict battery degradation or state-of-health (SOH). According to an exemplary embodiment, the method uses both a time-based algorithm and an event-based algorithm to predict or estimate battery degradation. The event-based algorithm may select certain data from the battery conditions (e.g., a state-of-charge (SOC) swing ($\Delta$SOC) or an SOC maximum ($SOC_{Max}$)), instead of using the entire set of battery condition data, and may use this information in its prediction or estimate.

19 Claims, 4 Drawing Sheets

METHOD FOR ESTIMATING BATTERY DEGRADATION IN A VEHICLE BATTERY PACK

TECHNICAL FIELD

The present invention generally relates to battery degradation and, more particularly, to methods for estimating or predicting battery degradation or state-of-health (SOH) in a vehicle battery pack.

BACKGROUND

In a vehicle having a battery pack used for vehicle propulsion—such as a hybrid electric vehicle, a plug-in hybrid electric vehicle (PHEV), a battery electrical vehicle (BEV), etc.—the battery pack is an important element to the operation of the vehicle. Hence, it may be advantageous to monitor the battery condition sometimes referred to as the state-of-health (SOH) and to provide information regarding the degradation level or an estimate of how much of its useful life is left. However, directly measuring battery degradation or the state-of-health (SOH) of the battery can be difficult or impractical, whereas estimating or predicting battery degradation or the state-of-health (SOH) may be preferred.

SUMMARY

According to one embodiment, there is provided a method for estimating battery degradation in a vehicle battery pack. The method may comprise the steps of: (a) receiving one or more battery conditions; (b) performing a time-based algorithm, wherein the time-based algorithm provides a time-based output; (c) performing an event-based algorithm, wherein the event-based algorithm extracts certain data from the battery conditions, uses the extracted data as an event-based input, and provides an event-based output in response to the event-based input; and (d) using the time-based output from the time-based algorithm and the event-based output from the event-based algorithm to estimate battery degradation in the vehicle battery pack.

According to another embodiment, there is provided a method for estimating battery degradation in a vehicle battery pack. The method may comprise the steps of: (a) receiving one or more battery conditions; (b) providing the battery conditions to an event-based sub-routine, wherein the event-based sub-routine comprises the steps of: (i) evaluating the battery conditions and identifying a state-of-charge (SOC) extremity and an SOC breakthrough; (ii) using the SOC extremity and the SOC breakthrough to determine an SOC swing ($\Delta$SOC); and (iii) returning the SOC swing ($\Delta$SOC) as an event-based input; (c) providing the event-based input to a data structure that correlates the event-based input to battery degradation and returns output that is used to form an event-based output; and (d) using the event-based output from the event-based algorithm to estimate battery degradation in the vehicle battery pack.

BRIEF DESCRIPTION OF THE DRAWINGS

Preferred exemplary embodiments of the invention will hereinafter be described in conjunction with the appended drawings, wherein like designations denote like elements, and wherein.

DETAILED DESCRIPTION OF THE PREFERRED EMBODIMENTS

Figure 1:
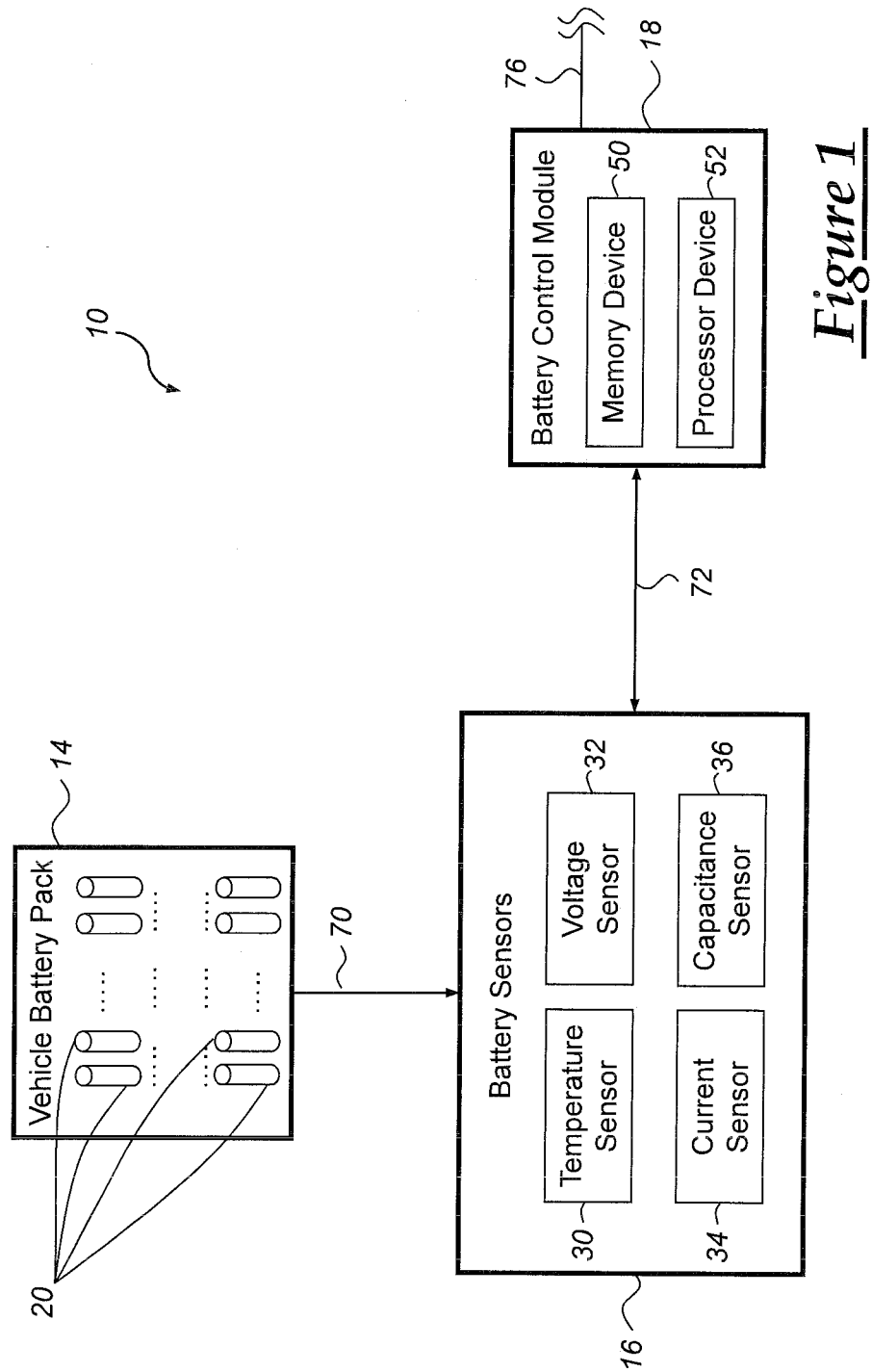
FIG. 1 is a schematic block diagram of an exemplary battery system.

With reference to FIG. 1, there is shown a general and schematic view of an exemplary battery system 10 that includes a battery pack having a number of individual battery cells. The method described below gathers information from two or more battery cells—for instance, information regarding the state-of-charge (SOC), temperature and/or other cell characteristics—and uses that information to estimate or predict battery degradation. It should be appreciated that the present method may be used with any type of vehicle battery pack, including those found in hybrid electric vehicles, plug-in hybrid electric vehicles (PHEVs), and battery electrical vehicles (BEVs), to name but a few. It is even possible to use the present method with other non-vehicle battery packs, such as those employed by uninterruptible power supplies, for instance. These are merely some of the possible applications, as the method described herein is not limited to the exemplary battery system shown in FIG. 1 and could be used with any number of different battery systems. According to one embodiment, battery system 10 includes a battery pack 14, battery sensors 16, and a battery control module 18.

Battery pack 14 provides the vehicle with electrical power and, depending on the particular embodiment, may be the primary vehicle power source or may be used in conjunction with another power source. Battery pack 14 includes a collection of individual battery cells 20 that are connected in series, parallel, or a combination of both in order to deliver a desired voltage, amperage, capacity, power density, and/or other performance characteristics. Generally, it is desirable for the battery pack to provide high power and energy densities, which has led to the development and use of many types of batteries including chemical, non chemical, and others. Some examples of suitable battery types that may be used by battery pack 14 include: all types of lithium-ion (e.g., lithium iron phosphate, lithium nickel manganese cobalt, lithium iron sulfide, lithium polymer, etc.), lead-acid, advanced lead-acid, nickel metal hydride (NiMH), nickel cadmium (NiCd), zinc bromide, sodium nickel chloride (NaNiCl), zinc air, vanadium redox, and others. Battery pack 14 may provide approximately 40-600V, depending on its particular design and application. For example, a heavy truck using a two-mode hybrid system may require a high voltage battery pack capable of providing about 350V, where a lighter vehicle may only need about 200V. In another embodiment, the battery system 10 may be part of a belt-alternator-starter (BAS) or BAS-plus type system and thus only require a battery pack that provides about 40-110V. In any case, battery pack 14 should be designed to withstand repeated charge and discharge cycles. Skilled artisans will appreciate that the system and method described herein are not limited to any one particular type of battery or battery arrangement, as a number of different battery embodiments could be used.

Battery sensors 16 may include any combination of hardware and/or software techniques capable of monitoring, sensing or otherwise determining battery conditions such as state of charge (SOC), temperature, voltage, current, capacitance, etc. According to one exemplary embodiment, battery sensors 16 include a temperature sensor 30, voltage sensor 32, current sensor 34, and capacitance sensor 36. Battery sensors 16 may be integrated within battery pack 14 (e.g., an intelligent or smart battery), they may be external sensors located outside of the battery pack (as schematically shown in FIG. 1), or they may be provided according to some other arrangement. Battery sensors 16 may monitor, sense or otherwise determine battery conditions for one or more individual cells, for a collection or block of cells within battery pack 14 (i.e., a subset of the overall collection of cells), for the entire battery pack, or according to some other method known in the art. Measuring battery conditions for an individual cell (e.g., $V_{Cell}$, $SOC_{Cell}$, $T_{Cell}$) may be beneficial if, for example, the middle cells experience different temperatures or other battery conditions than the edge or boundary cells of battery pack 14. The same principal of determining battery temperature on a cell-by-cell, collective or other basis also applies to battery voltage, battery current, battery capacitance, or any other battery condition. Battery sensors 16 may employ any type of suitable technique or method for measurement, estimation, evaluation, etc.; this includes both directly and indirectly determining battery conditions. Output from battery sensors 16 may be provided to battery control module 18 or some other appropriate device via a suitable vehicle communications connection 72 (e.g, a CAN bus, a SPI connection, etc.).

Battery control module 18 may include any variety of electronic processing devices, memory devices, input/output (I/O) devices, and/or other known techniques, and may perform various control and/or communication related functions. In an exemplary embodiment, battery control module 18 includes an electronic memory device 50 that stores various sensor readings (e.g., sensor readings from sensors 30, 32, 34, 36, etc.), look up tables or other data structures, algorithms, etc. In another capacity, memory device 50 can store pertinent battery characteristics and background information pertaining to the battery's cell chemistry, cell capacity, upper and lower battery voltage limits, battery current limits, battery temperature limits, temperature profiles, battery impedance, number or history of charge/discharge cycles, etc. In the exemplary embodiment shown in FIG. 1, battery control module 18 also includes a processor device 52 (e.g., a microprocessor, a microcontroller, an application specific integrated circuit (ASIC), etc.) that executes instructions for software, firmware, programs, algorithms, scripts, etc. that are stored in memory device 50 and may govern the processes and methods described herein. Battery control module 18 can be electronically connected to other vehicle devices and modules via a suitable vehicle communications connection 76 and can interact with them when required. These are, of course, only some of the possible arrangements, functions and capabilities of battery control module 18, as other embodiments could also be used.

Depending on the particular embodiment, battery control module 18 may be a stand-alone vehicle electronic module, it may incorporated or included within another vehicle electronic module (e.g., a power train control module or a hybrid control module), or it may be part of a larger network or system (e.g., a battery management system (BMS), a vehicle energy management system, etc.), to name a few possibilities. Battery control module 18 may also be part of or interact with a system that determines a desired hybrid operating mode (e.g., accelerating, braking, idling, stopping, etc.) and may implement electrical power management actions accordingly. Many different battery types and arrangements may be used with the method described below; for instance, the battery pack 14, battery sensors 16, and control module 18 may all be integrated and included within one package or they could be separate techniques.

Figure 2:
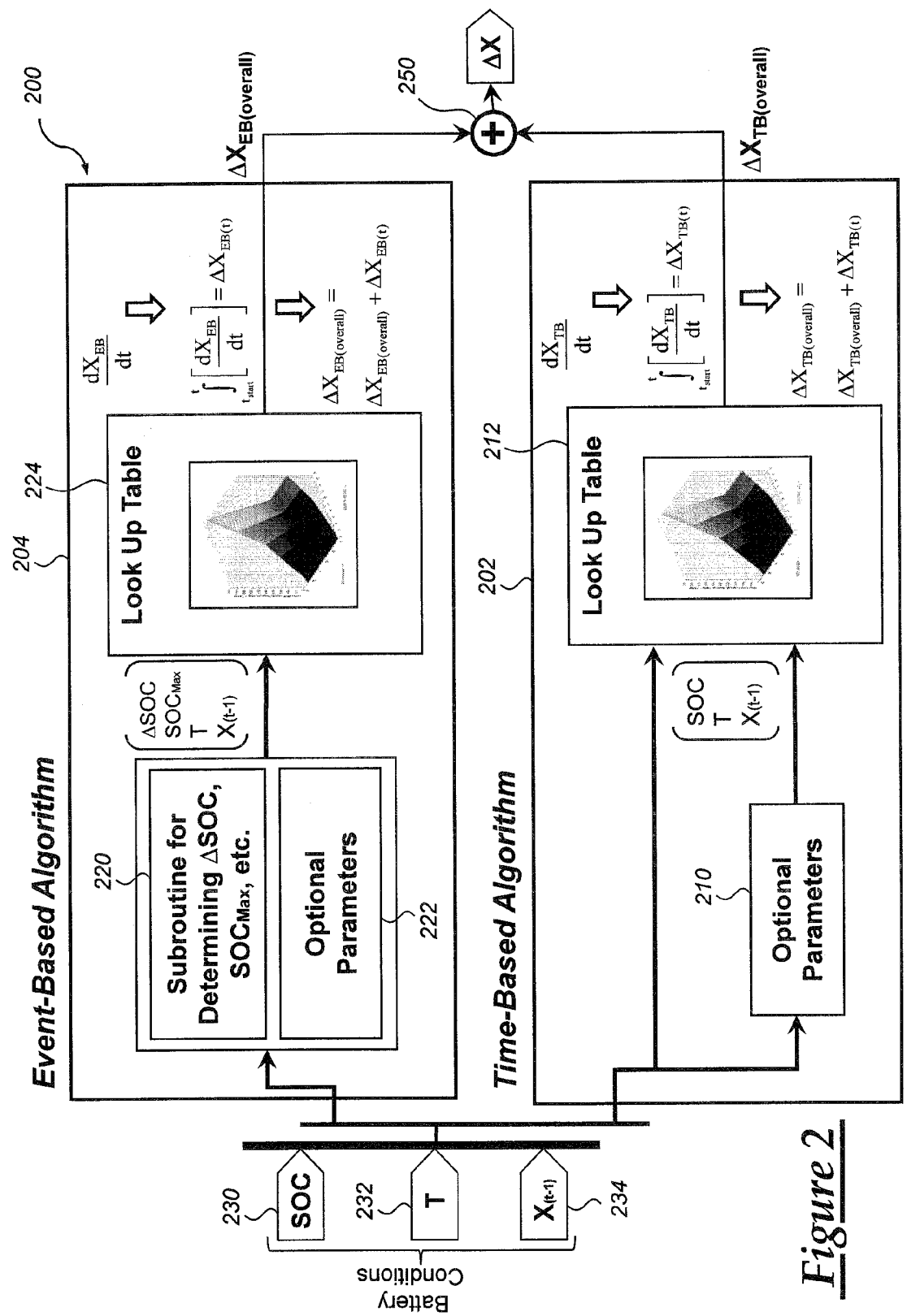
FIG. 2 is a schematic illustration of an exemplary method that may be used to estimate or predict battery degradation and may be used with the exemplary system of FIG. 1.

Turning now to FIG. 2, there is shown a general illustration of an exemplary method 200 that may be used to estimate or predict one or more aspects of battery degradation (e.g., the state of health (SOH) of one or more battery cells). It is generally understood that battery performance or health will likely deteriorate or diminish over time due to a number of potential factors (e.g., the type of battery chemistry used, the amount and nature of the battery usage, the age of the battery, etc.). The state of health (SOH) of a battery can involve a comparison of the battery's current condition compared to the battery's ideal condition (e.g., a new battery), and can be measured according to a number of different techniques (different battery makers sometimes measure SOH differently). Various battery conditions are interconnected or related with one another such that certain relationships exist between them. For example, as a battery pack ages its internal resistance builds up which reduces the ability to deliver and accept power. Comparing the current internal resistance of the battery pack with the internal resistance of the battery pack when it was new can provide an indication of the state of health (SOH) of the battery pack and of any battery degradation that may have occurred. The same principle may apply to battery impedance, as well as other battery conditions. The term state of health (SOH), as it is used herein, is not limited to comparisons of the battery's internal resistance, impedance and/or capacitance, as other suitable criteria may be used to define SOH instead.

Method 200 estimates or predicts battery degradation, also known as the state-of-health (SOH), using two different algorithms: a time-based algorithm 202 and an event-based algorithm 204. By using both algorithms 202 and 204 in the battery degradation estimate, as opposed to only using a time-based algorithm, method 200 is able to provide an accurate estimate of battery degradation and is able to do so in an efficient manner. According to an exemplary embodiment, the time-based algorithm 202 receives the battery conditions on a periodic basis (e.g., once per millisecond, once per second, etc.), uses the battery conditions as a time-based input, and provides a time-based output in response to the time-based input. According to the same exemplary embodiment, the event-based algorithm 204 receives the battery conditions on a periodic basis, extracts certain data from the battery conditions (e.g., SOC extremities, SOC breakthroughs, etc.), uses the extracted data as an event-based input, and provides an event-based output in response to the event-based input. The time-based output and the event-based output are then combined when estimating battery degradation in the vehicle battery pack.

Using both a time-based output and an event-based output when estimating battery degradation or state-of-health (SOH) may be helpful for a variety of reasons. For instance, the time-based algorithm 202 may not take into consideration certain intra-sampling events that can occur, as it simply uses the periodically sampled battery conditions as the time-based input for its algorithms, look-up tables, etc. It is possible, for example, for the time-based algorithm 202 to miss certain battery conditions if they occur in between sampling events (e.g., if cell SOC readings are taken every second and a cell SOC were to momentarily peak in between readings, then this information may not be captured or noticed by time-based algorithm 202). The event-based algorithm 204, on the other hand, extracts certain data from the battery conditions—like SOC extremities and SOC breakthroughs, as will be explained—and may capture such a momentary event.

Method 200 determines one or more battery conditions, and may do so according to a variety of different techniques. In one embodiment, battery conditions are gathered, acquired or otherwise determined whenever the vehicle is 'on' (this may include times when the battery is charging, discharging and/or is idle) and at to a sampling rate that may be a static or a dynamic rate. According to an exemplary dynamic sampling rate embodiment, the sampling rate (and conversely the amount of time in between readings) is altered or modified in order to accommodate the battery conditions. For example, if the battery conditions become quite volatile such that they are changing at a relatively rapid pace, then it may be preferable to increase the sampling rate so that the battery conditions are monitored more frequently. The sampling rate may be reduced at a later time once the battery conditions become more stabilized. Battery control module 18 could even control the sampling rate of battery sensors 16 in order to manage the resources of memory device 50 and processor device 52 in an optimum fashion. As already mentioned, the battery conditions may be determined on a cell-by-cell basis (e.g., a voltage reading could be obtained for every battery cell 20), on a cell group-by-cell group basis (e.g., an average voltage reading could be determined for a group or block of battery cells), on a representative cell basis (e.g., a worst or best case battery cell, a randomly selected battery cell, etc.), or according to some other suitable technique. Also, the battery conditions may include any combination of one or more conditions, including a state-of-charge (SOC) and at least one additional battery condition selected from the group consisting of: a temperature, a voltage, a current, and a rate of change of SOC (C-Rate). Method 200 is not limited to any particular process or technique for determining or gathering battery conditions, as any suitable one may be used.

Time-based algorithm 202 receives battery conditions (e.g., state-of-charge (SOC) 230, temperature (T) 232, etc.), uses the battery conditions along with other optional parameters 210 (e.g., a feedback component $(X_{(t-1)})$ 234 which is the previous overall battery degradation prediction) as a time-based input, and provides a time-based output in response. According to an exemplary embodiment of the time-based algorithm 202, a state-of-charge reading (SOC), a temperature reading (T), and a feedback component $(X_{(t-1)})$ (collectively, time-based input) are provided to a data structure that correlates the time-based input to battery degradation. The data structure 212, which may include one or more multi-dimensional look-up tables and/or other data structures, generates output that corresponds to the predicted or estimated battery degradation or state-of-health (SOH) of the vehicle battery pack. The exact type and nature of the output from data structure 212 can vary depending on the specific application, but may include a rate of change of battery degradation $(dX_{TB}/dt)$, an actual change in battery degradation $(\Delta X_{TB})$, and/or an absolute value of battery degradation $(X_{TB})$, to cite a few possibilities. Skilled artisans will appreciate that a voltage reading (V) is used to determine or calculate a state-of-charge reading (SOC); thus, V and SOC readings may be used interchangeably, as either value could be inputted into data structure 212. The data structure 212—whether it be a look-up table or otherwise—may be created during battery development by the battery manufacturer, during vehicle development by the vehicle manufacturer, or by any other suitable entity.

According to one example, look-up table 212 returns a rate of change in battery degradation $(dX_{TB}/dt)$, which represents the rate of change in battery degradation or state-of-health (SOH) over the last time step. The rate of change in battery degradation $(dX_{TB}/dt)$ is then integrated over a time step (t) in order to return an actual change in battery degradation $(\Delta X_{TB(t)})$, which is representative of the actual change in battery degradation or SOH for a particular battery cell or cell group over the last time step (t). The actual change in battery degradation for the last time step $(\Delta X_{TB(t)})$ is then added to a running total that keeps track of the overall change in battery degradation $(\Delta X_{TB(overall)})$ to arrive at the time-based output previously mentioned. The overall time-based output $(\Delta X_{TB(overall)})$ generated by time-based algorithm 202 is generally representative of the total amount of change in the state-of-health (SOH) of the battery cell or cell group in question, since the battery was initially monitored. In this fashion, an ongoing tally can be maintained to determine how much battery degradation has occurred over the life of the battery pack. If the time-based output $(\Delta X_{TB(overall)})$ relates to internal resistance, then the total value tends to increase over time; if $(\Delta X_{TB(overall)})$ relates to cell capacitance, then the total value tends to decrease over time. As previously mentioned, battery degradation or state-of-health (SOH) is oftentimes representative of the internal resistance or capacitance of a battery cell or cell group, but it may be representative of other parameters or conditions as well. The time-based output described herein is not limited to any particular output type. Skilled artisans will appreciate that other mathematical and algorithmic techniques may be employed by time-based algorithm 202 when performing the derivation, integration, summation, and other exemplary steps described above, including other methods and techniques not described here. It is not necessary for time-based algorithm 202 to use the exact combination and sequence of exemplary steps recited above.

Time-based algorithm 202 provides a time-based output $(\Delta X_{TB(overall)})$ to a summing or combining step 250, where it is added to or combined with an event-based output $(\Delta X_{EB(overall)})$. It should be appreciated that the specific type of output provided by time-based algorithm 202 to summing step 250 may vary and is not limited to the exemplary time-based output $(\Delta X_{TB(overall)})$ previously described. For instance, the time-based output may be provided as a rate of change of battery degradation (e.g., a d/dt value), a difference or actual change in battery degradation (e.g., a $\Delta$ value), or an absolute or actual value for battery degradation, to cite several possibilities. The "time-based output" provided by time-based algorithm 202 broadly includes any type of output that is representative of internal resistance, capacitance, or any other battery condition that can be representative of battery degradation or the state-of-health (SOH) of the battery.

As previously mentioned, method 200 may also use an event-based algorithm 204 to provide additional information that is helpful in generating an accurate overall battery degradation estimate or prediction. Event-based algorithm 204 uses a different method of selecting input from the battery conditions than does the time-based algorithm 202. The event-based algorithm 204 may select and record certain battery conditions (e.g., upper and lower SOC extremities) on an event-based or aperiodic basis, as opposed to selecting battery conditions on a time-based or periodic basis like time-based algorithm 202. As stated earlier, time-based sampling could miss certain peaks and valleys in the battery conditions if they occur between sampling events; such information could affect the overall battery degradation prediction or state-of-health (SOH) estimate. Battery degradation can be influenced by a number of factors, including the severity of SOC swings, higher SOC levels, higher battery currents, increased temperatures, etc. The event-based algorithm 204 is designed to capture and consider certain events that can influence the overall battery degradation estimate, but may not be captured by the time-based algorithm 202. Moreover, by only selecting and recording certain events, as opposed to an entire battery condition course or history, event-based algorithm 204 avoids using excessive memory and processing resources; a feature that may be important in certain applications, such as vehicles.

Figure 3:
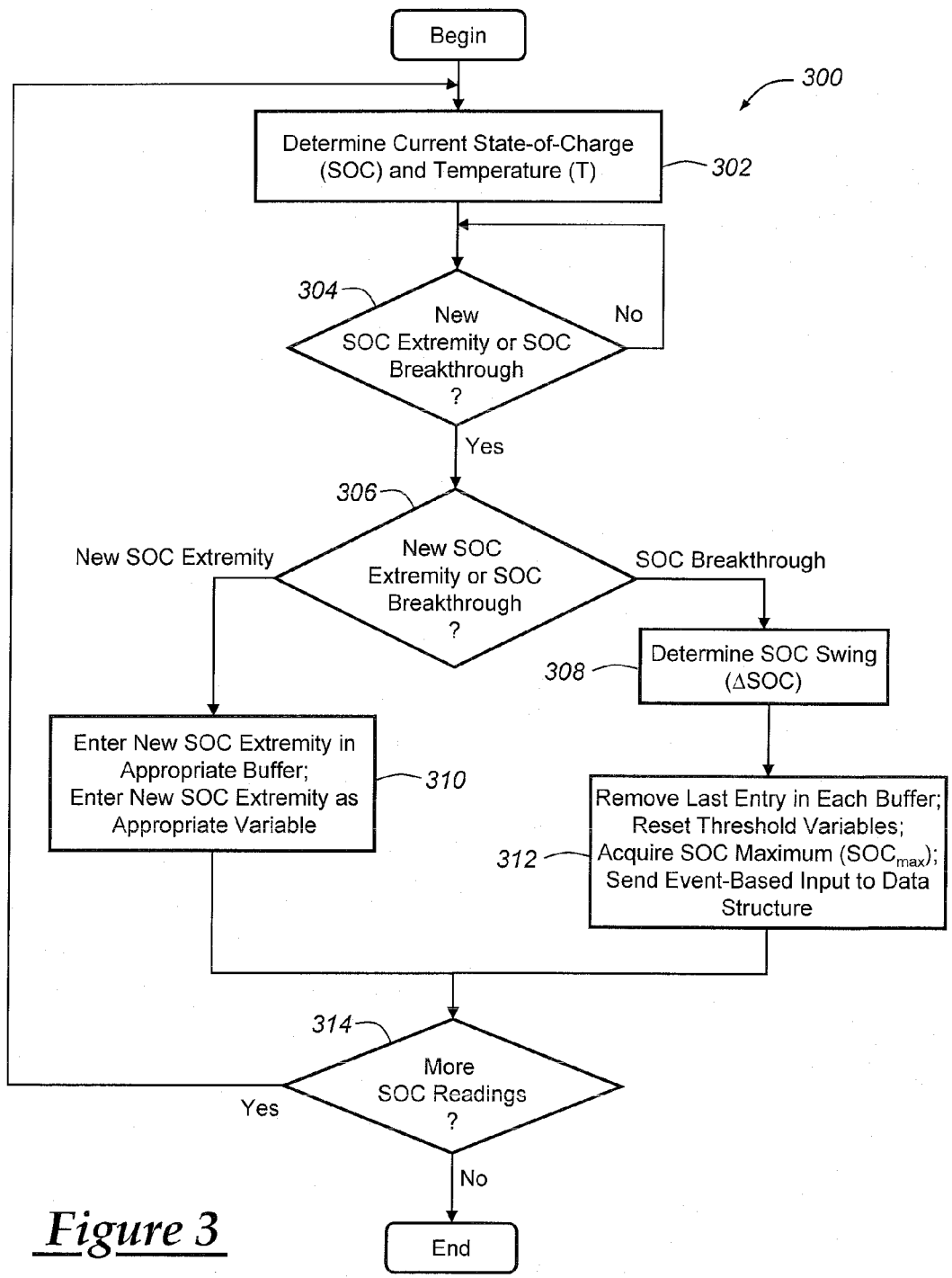
FIG. 3 is a flowchart of an exemplary method that may be used to extract certain data from battery conditions provided by battery sensors and may provide the extracted data to the exemplary method illustrated in FIG. 2.
Figure 4:
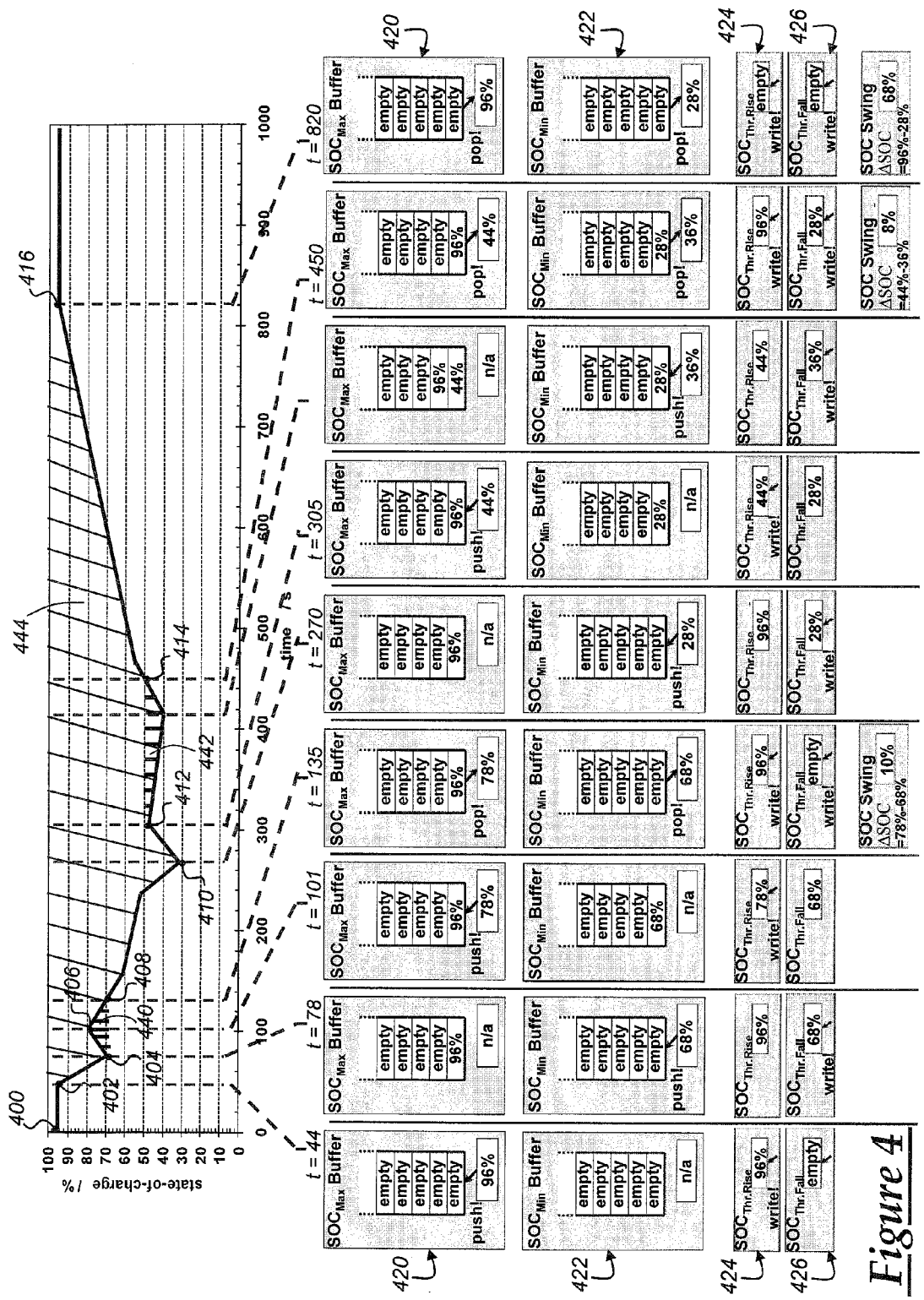
FIG. 4 is a chart that illustrates some of the aspects of the exemplary method shown in FIG. 3.

Some of the steps of the event-based algorithm 204 may be similar to those already described in conjunction with the time-based algorithm 202 and are, thus, not repeated here. Generally speaking, event-based algorithm 204 receives battery conditions (e.g., state-of-charge (SOC) 230, temperature (T) 232, etc.), extracts certain data from the battery conditions (e.g., SOC swings (ΔSOC) and SOC extremities ($SOC_{Max}$, $SOC_{Min}$), etc.), uses the extracted data 220 along with other optional parameters 222 as event-based input, and provides an event-based output in response. Beginning with the data extraction step, FIGS. 3 and 4 illustrate an exemplary method 300 that acts as a sub-routine of sorts and extracts certain data from the stream of battery conditions coming in and uses the extracted data as event-based input for the event-based algorithm 204. The battery conditions used by method 300, according to this exemplary embodiment, include SOC- and temperature-related data and are provided by battery sensors 16. By extracting and saving only some of the SOC- and temperature-related data—as opposed to saving the entire SOC and temperature course or history—method 300 is able to significantly decrease the amount of data that needs to be stored and processed at the vehicle, yet capture many of the data points that are pertinent to the battery degradation prediction.

Beginning at step 302, the method determines or gathers a current cell state-of-charge (SOC) reading and a current cell temperature reading. Although the following exemplary description is provided on a cell-by-cell basis, it should be appreciated that it also applies to a cell group-by-cell group basis, on a representative-cell basis, as well as any other suitable basis. In one embodiment, battery sensors 16 monitor battery cells 20 and provide a current cell state-of-charge (SOC) reading and a temperature (T) reading to control module 18.

Step 304 determines if a new SOC extremity or an SOC breakthrough has occurred. In one embodiment, processor 52 compares the new SOC reading to SOC readings that were previously saved in memory device 50 in order to determine if there is a change in the trend of the readings that results in a peak or valley (an SOC extremity) or if the new SOC reading has risen above or fallen below an old SOC extremity (an SOC breakthrough). Any number of techniques may be used for making such determinations. An "SOC extremity" broadly includes any peak or valley in the SOC readings (some examples include points 402, 404 and 406 in FIG. 4), and may include global and local minimums and maximums. An "SOC breakthrough" broadly includes any point where the SOC readings rise above or fall below a previously determined SOC extremity, but does so without creating a new SOC extremity (an example includes point 408 in FIG. 4). In the chart illustrated in FIG. 4, between the starting point 400 and point 402, there could be a number of SOC readings that are not recorded because step 304 determines that they are neither an SOC extremity nor are they an SOC breakthrough. In such a case, step 304 causes the method to simply circle back and perform the evaluation again on the next time step with the next SOC reading and may continue to do so until an SOC extremity or an SOC breakthrough is identified. The SOC readings may be evaluated on a periodic basis (e.g., a new SOC reading evaluated every time step of 1 second or so), or they could be evaluated on some other basis.

When point 402 is encountered at about the $44^{th}$ second, step 304 recognizes that there is a change in the trend of the SOC readings and determines that it is an SOC extremity (it is a type of peak) that corresponds to a value of about 96%. Because point 402 is the first SOC extremity encountered in this example, step 306 sends the method to step 310 where the value 96% is entered or pushed into the lowest buffer location of the $SOC_{Max}$ buffer 420, and the value 96% is written into a rising threshold variable $SOC_{Thr.Rise}$ 424. If the new SOC extremity were a valley instead of a peak, it would instead be entered into the $SOC_{Min}$ buffer 422 and the falling threshold variable $SOC_{Thr.Fall}$ 426. Because there are more SOC readings to evaluate, step 314 sends control back to step 302 for additional monitoring, where a new SOC reading is evaluated each time step. According to this example, additional monitoring continues without identifying any SOC extremities or SOC breakthroughs, until the method reaches point 404 at about the $78^{th}$ second.

Point 404 is a valley in the SOC readings and represents an SOC extremity with a value of about 68%. After detecting a change in trend in the SOC readings and identifying the valley at point 404, step 304 sends control to step 306, which in turn directs control of the method to step 310. The value 68% is entered or pushed into the lowest buffer location in $SOC_{Min}$ buffer 422 and 68% is written into a falling threshold variable $SOC_{Thr.Fall}$ 426, step 310. Step 314 then returns control of the method to step 302. Additional monitoring continues without any significant events until point 406 is encountered at about the $101^{st}$ second, which represents another SOC extremity or peak at approximately 78%. Steps 304 and 306 recognize it as such and send control of the method to step 310, where the value 78% is entered into the lowest buffer location in the $SOC_{Max}$ buffer 420 such that the previous value of 96% is pushed up one spot. It should be appreciated that following the $101^{st}$ second mark, the $SOC_{Max}$ buffer 420 would have two entries: a 96% entry at the second lowest buffer location and a 78% entry at the lowest buffer location (this is not shown in FIG. 4). At this point, peak 402 may be considered a global maximum and point 406 a local maximum.

Monitoring continues until point 408 is encountered around the $135^{th}$ second, which is the first SOC breakthrough of this example. Point 408 represents the first point where the current SOC readings break through a previously recorded SOC extremity; in this case, the SOC readings fall below the previously established SOC minimum of 68%, as maintained by the falling threshold variable $SOC_{Thr.Fall}$ 426. An SOC breakthrough could also occur where the SOC readings rise above a previously established SOC maximum. Thus, a complete SOC cycle has occurred; the SOC readings started at 68%, rose to 78% and fell back again to 68% (this complete cycle is illustrated by the shaded area 440 in FIG. 4). Step 304 recognizes that an SOC breakthrough has occurred and sends control of the method to step 306, where it is routed to step 308. Step 308 calculates an SOC swing of 10% (ΔSOC=78%−68%=10%) and, according to one example, retrieves the SOC maximum ($SOC_{Max}$) value at that time and/or a temperature (T) reading. The SOC maximum ($SOC_{Max}$) value may be retrieved by extracting that value from the current rising threshold variable $SOC_{Thr.Rise}$ 424), for example. This type of information may be useful for putting the SOC swing data into context, as it provides additional background on the environment surrounding the battery cell at or near the time that the SOC swing information was acquired. According to an exemplary embodiment, method 300 provides the newly calculated SOC swing (ΔSOC), the current SOC maximum ($SOC_{Max}$) and/or the temperature (T) data back to the event-based algorithm 204

(e.g., data structure 224) at this time so that a battery degradation prediction can be performed. It is also possible for the newly calculated SOC swing (ΔSOC), the current SOC maximum ($SOC_{Max}$) and/or the temperature (T) data to be stored for later provision back to the event-based algorithm 204.

Now that this SOC swing (ΔSOC) has been calculated and accounted for, step 312 removes or pops the 78% and 68% SOC values from buffers 420 and 422, respectively, and resets the threshold variables 424 and 426 with the values that are now lowest in the respective buffers. Thus, when the method detects an SOC breakthrough, an SOC swing (ΔSOC) is determined by subtracting a lower SOC extremity from an upper SOC extremity and then makes changes to the corresponding buffers and variables. This exemplary process of determining SOC swings and modifying the buffers and variables uses a last-in-first-out (LIFO) type process, although other processes and techniques may be used instead. The process then loops back to step 302 for continued monitoring.

Monitoring of the SOC readings continues until point 410 is encountered around the 270$^{th}$ second. At that point, step 304 recognizes that an SOC extremity (in this case a valley) has been encountered, so control is sent to steps 306 and 310 where the value 28% is entered into the lowest buffer location of the $SOC_{Min}$ buffer 422 and is written into the falling threshold variable $SOC_{Thr.Fall}$ 426. At point 412, an SOC extremity is detected (this time, it is a peak or local maximum) around the 305$^{th}$ second, however, no SOC breakthrough occurs because point 412 does not surpass the current rising threshold variable $SOC_{Thr.Rise}$ 424 (which is currently set at 96%). Thus, step 310 enters or pops the 44% value into the $SOC_{Max}$ buffer 420 and pushes the 96% entry up one buffer location, and writes the 44% value into the rising threshold variable $SOC_{Thr.Rise}$ 424. This is illustrated in FIG. 4 in the buffers and variables following the 305$^{th}$ second time step. A description of the additional valley located between points 412 and 414 has been omitted for purposes of brevity.

Moving on to point 414 around the 450$^{th}$ second, another SOC breakthrough is detected because the SOC readings surpass the current rising threshold variable $SOC_{Thr.Rise}$ 424 (which is presently set at 44%). As before, steps 304 and 306 send control of the method to step 308, where it calculates an SOC swing of 8% (ΔSOC=44%−36%=8%). Now that the SOC swing has been accounted for, step 312 removes or pops the 44% and 36% SOC values from buffers 420 and 422, respectively, and resets variables 424 and 426. This SOC swing (ΔSOC) is illustrated in FIG. 4 by the shaded area 442. A corresponding SOC maximum ($SOC_{Max}$) value and/or a temperature (T) reading may be gathered at this time to accompany the newly calculated SOC swing (ΔSOC); a local maximum and/or a global maximum may be used for this purpose.

A charging cycle continues until point 416 at about the 820$^{th}$ second (it is a charging cycle because the SOC is consistently increasing during this period), at which point a peak or SOC extremity is detected at about 96%. Point 416 may represent both an SOC extremity and an SOC breakthrough, but according to this particular embodiment is sent by steps 304 and 306 to step 308 for processing as an SOC breakthrough; other techniques for addressing such a situation as an SOC extremity could also be used. Step 308 calculates an SOC swing of 68% (ΔSOC=96%−28%=68%). Step 312 then removes or pops the 96% and 28% SOC values from buffers 420 and 422, respectively, and resets variables 424 and 426. This SOC swing (ΔSOC) is illustrated in FIG. 4 by the large shaded area 444. A corresponding SOC maximum ($SOC_{Max}$) value and/or a temperature (T) reading may be gathered at this time to accompany the newly calculated SOC swing (ΔSOC) value.

The SOC swing (ΔSOC), SOC maximum ($SOC_{Max}$) and/or temperature (T) data that is extracted or selected from the battery conditions may be provided by method 300 to data structure 224 as event-based input at any one or more times during the process. As described above, it is possible for method 300 to provide this data to data structure 224 each time an SOC breakthrough is detected (e.g., at points 408, 414, 416). In such a case, method 300 could simply provide the recently calculated SOC swing (ΔSOC) value, along with the current SOC maximum ($SOC_{Max}$) value found in the current rising threshold variable $SOC_{Thr.Rise}$ 424. Alternatively, the SOC swing (ΔSOC), SOC maximum ($SOC_{Max}$) and/or temperature (T) data that is extracted at different points from the battery conditions by method 300 could be sent back to the event-based algorithm 204 together in groups. For example, method 300 could wait and provide this data to data structure 224 as a batch at the end of a monitoring cycle or at some other time (e.g., at point 416).

It should be appreciated that the preceding examples described in connection with FIGS. 3 and 4 are merely exemplary and that other embodiments and techniques could be used instead. For example, it is possible for method 300 to provide a temperature reading (T) with each piece of SOC swing (ΔSOC) and/or SOC maximum ($SOC_{Max}$) data. For example, a temperature reading (T) may be taken at points 402-416 in order to provide some background information regarding the thermal environment of the battery cell at the time that the SOC data is extracted from the battery conditions. It is also possible to use method 300 with battery conditions other than the state-of-charge (SOC). For example, cell voltage (V) or some other battery condition could be monitored and evaluated for extremities, breakthroughs, etc., according to the method described above. It is also possible for method 300 to act upon events other than just extremities and breakthroughs, such as the two transition points located between points 408 and 410. Skilled artisans will appreciate that battery sensors 16 may provide voltage (V) readings to battery control module 18, which converts the voltage (V) readings into state-of-charge (SOC) readings or something else, or the battery sensors may be smart sensors that actually transmit the readings as SOC readings. Other embodiments are certainly possible, as the preceding represent only some of the possibilities.

In some embodiments it may be possible and desirable to determine a maximum required size for one or more of the buffers mentioned above. For example, the maximum required size for a buffer may be equal to the maximum used state-of-charge (SOC) window divided by the number of SOC discretisation steps. This means that every SOC level will only be saved once in the buffer because if it occurs again, then a preceding SOC swing will be counted, thus, freeing up two buffer slots. It should be appreciated that this is only one possibility and is certainly not necessary or required.

Turning back to FIG. 2, there is shown an exemplary embodiment of the event-based algorithm 204, where the event-based input may include the SOC swing (ΔSOC) data, the SOC maximum ($SOC_{Max}$) data, and the temperature (T) data extracted and provided by method 300, as well as a feedback component ($X_{(t-1)}$) which may be the previous overall battery degradation prediction. This input can be provided to a data structure that correlates the event-based input to battery degradation. The data structure 224, which may include one or more multi-dimensional look-up tables and/or other data structures, generates output that corresponds to the predicted or estimated battery degradation or state-of-health (SOH) of the vehicle battery pack. Data structure 224 may be different than data structure 212. Data structure 224 could be designed to not only consider the overall amount of an SOC swing, but also the depth or severity of discharge. For example, consider a first discharge/charge sequence that transitions through the following SOC values: 85% to 50% to 85% to 50% and back to 85%. This results in two SOC swings (ΔSOC) of 35% each, resulting in a total SOC swing of 70%. Consider a second discharge/charge sequence that transitions from 85% to 15% and back to 85%. This too results in a total SOC swing of 70%, but it is a deeper discharge and may have more of an impact on battery degradation or state-of-health (SOH) than the first example. Data structure 224 may be designed to take these types of factors into account, and may do so on a tailored basis that considers the type of battery chemistry involved, etc.

Some optional parameters 222 that may also be used by event-based algorithm 204 include: cell internal resistance (R), cell capacitance (C), cell C-Rate (CR), temperature (T), etc. If a temperature parameter is provided by 222, it may be possible to omit the temperature (T) data provided by method 300. In one embodiment, the optional parameters 222 include a temperature averaging sub-routine that provides an average temperature over a certain period. A more in depth explanation of some of these optional battery conditions is provided above.

The exact type and nature of the output from data structure 224 varies depending on the specific application, but may include a rate of change of battery degradation ($dX_{EB}/dt$), an actual change in battery degradation ($\Delta X_{EB}$), and/or an absolute value of battery degradation ($X_{EB}$), to cite a few possibilities. Skilled artisans will appreciate that a voltage reading (V) is used to determine or calculate a state-of-charge reading (SOC); thus, V and SOC readings may be used interchangeably, as either value could be inputted into data structure 224, for example. The data structure 224—whether it be a look-up table or otherwise—may be created during battery development by the battery manufacturer, during vehicle development by the vehicle manufacturer, or by any other suitable entity. In an exemplary embodiment, the output from data structure 224 is a rate of change of battery degradation $dX_{EB}/dt$, which is then integrated and added with a running total of the event-based degradation to arrive at an overall event-based output ($\Delta X_{EB(overall)}$). This process is described above in connection with the time-based algorithm 202 and is not repeated here.

Event-based algorithm 204 provides the event-based output ($\Delta X_{EB(overall)}$) to the summing or combining step 250, where it is added to or combined with the time-based output ($\Delta X_{TB(overall)}$) to result in an overall battery degradation prediction or estimate ($\Delta X$) for the lifetime of the battery. In instances where the battery degradation is expressed in terms of internal resistance, it is expected that both the time-based output ($\Delta X_{TB(overall)}$) and the event-based output ($\Delta X_{EB(overall)}$) will be positive values such that their sum is also positive. In cases where the battery degradation is expressed in terms of capacitance, it is expected that both the time-based output ($\Delta X_{TB(overall)}$) and the event-based output ($\Delta X_{EB(overall)}$) will be negative values such that their sum is also negative. In a first exemplary embodiment, the overall battery degradation estimate ($\Delta X$) is provided in the context of either internal resistance or capacitance; in a second exemplary embodiment, the overall battery degradation estimate ($\Delta X$) is provided in the context of both internal resistance and capacitance (e.g., by performing two separate analyses).

It should be appreciated that the specific type of output provided by event-based algorithm 204 to summing step 250 may vary and is not limited to the exemplary event-based output ($\Delta X_{EB(overall)}$) previously described. For instance, the event-based output may be provided as a rate of change of battery degradation (e.g., a d/dt value), a difference or actual change in battery degradation (e.g., a Δ value), or an absolute or actual value for battery degradation, to cite several possibilities. The "event-based output" provided by event-based algorithm 204 broadly includes any type of output that is representative of internal resistance, capacitance, or any other battery condition that can be representative of battery degradation or the state-of-health (SOH) of the battery.

An accurate overall battery degradation (ΔX) estimate or prediction can provide information regarding the battery's state-of-health (SOH) and may be helpful during the lifetime of the battery pack, during the design of the product using the battery pack, or at some other time and/or some other capacity. Some suitable usages of battery SOH include: determining battery suitability (e.g., selecting the appropriate battery for the application, the appropriate cells for working and/or storage conditions, etc.), determining supplier reliability, evaluating maintenance and warranty issues (e.g., advance warning signs, recommended maintenance, conditioning and/or battery replacement, warranty duration determination, warranty claims validation, etc.), adjusting battery management parameters (e.g., manipulating battery use, etc. to improve rate of SOH deterioration), and improving system operation, to name but a few. Method 200 may be used with any number of different cell chemistries, for which different look up tables, calibration factors, etc. could be used.

It is to be understood that the foregoing description is not a definition of the invention, but is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. For example, it is not necessary for the particular combination and sequence of steps in methods 200 and 300 to be performed in the exact manner described above. The time-based algorithm 202 and the event-based algorithm 204 may be performed in any order or at the same time, for example. All such other embodiments, changes, and modifications are intended to come within the scope of the appended claims.

As used in this specification and claims, the terms "for example," "e.g.," "for instance," "such as," and "like," and the verbs "comprising," "having," "including," and their other verb forms, when used in conjunction with a listing of one or more techniques or other items, are each to be construed as open-ended, meaning that that the listing is not to be considered as excluding other, additional techniques or items. Other terms are to be construed using their broadest reasonable meaning unless they are used in a context that requires a different interpretation.

The invention claimed is:

1. A method for estimating battery degradation in a vehicle battery pack, comprising the steps of:
   (a) receiving one or more battery conditions at a battery control module;
   (b) performing a time-based algorithm, wherein the time-based algorithm uses the battery conditions as time-based input, correlates the time-based input to battery degradation using a first data structure, and provides a time-based output that is representative of the correlated battery degradation;
   (c) performing an event-based algorithm, wherein the event-based algorithm extracts a portion of the data from the battery conditions, uses the extracted data as an event-based input, correlates the event-based input to battery degradation using a second data structure, and provides an event-based output that is representative of the correlated battery degradation and is separate from the time-based output, both the time-based input and the event-based input include state-of-charge (SOC) data; and (d) using a battery control module to combine the time-based output from the time-based algorithm and the separate event-based output from the event-based algorithm in order to estimate battery degradation in the vehicle battery pack.

2. The method of claim 1, wherein the battery conditions include a state-of-charge (SOC) and at least one additional battery condition selected from the group consisting of: a temperature, a voltage, a current, and a rate of change of SOC (C-Rate).

3. The method of claim 1, wherein the battery conditions are determined on a cell-by-cell basis, on a cell group-by-cell group basis, or on a representative cell basis.

4. The method of claim 1, wherein step (b) further comprises providing a time-based input to a data structure that correlates the time-based input to battery degradation and provides output that is used to form the time-based output.

5. The method of claim 4, wherein the data structure returns a rate of change in battery degradation ($dX_{TB}/dt$), the rate of change in battery degradation ($dX_{TB}/dt$) is integrated over a time-step (t) to return an actual change in battery degradation ($\Delta X_{TB(t)}$), and the actual change in battery degradation ($\Delta X_{TB(t)}$) is added to a running total that keeps track of the change in battery degradation ($\Delta X_{TB(overall)}$) to arrive at the time-based output in step (b).

6. The method of claim 1, wherein step (c) further comprises extracting certain data from the battery conditions by identifying at least one state-of-charge (SOC) extremity or at least one state-of-charge (SOC) breakthrough from the battery conditions.

7. The method of claim 6, wherein state-of-charge (SOC) readings are part of the battery conditions, and the state-of-charge (SOC) extremity corresponds to a peak or valley in state-of-charge (SOC) readings, and the state-of-charge (SOC) breakthrough corresponds to a point where state-of-charge (SOC) readings rise above or fall below a previously identified state-of-charge (SOC) extremity, but do so without creating a new state-of-charge (SOC) extremity.

8. The method of claim 6, wherein step (c) further comprises detecting an SOC breakthrough and determining an SOC swing ($\Delta SOC$) in response to detecting the SOC breakthrough, wherein the SOC swing ($\Delta SOC$) is included within the event-based input.

9. The method of claim 8, wherein step (c) further comprises determining the SOC swing ($\Delta SOC$) according to a last-in-first-out (LIFO) process.

10. The method of claim 8, wherein step (c) further comprises extracting an SOC swing ($\Delta SOC$) and an SOC maximum ($SOC_{Max}$) from the battery conditions, and providing the SOC swing ($\Delta SOC$) and the SOC maximum ($SOC_{Max}$) as event-based input each time an SOC breakthrough is detected.

11. The method of claim 10, wherein step (c) further comprises providing a temperature reading (T) with the SOC swing ($\Delta SOC$) and the SOC maximum ($SOC_{Max}$) as event-based input.

12. The method of claim 1, wherein step (c) further comprises providing the event-based input to a data structure that correlates the event-based input to battery degradation and provides output that is used to form the event-based output.

13. The method of claim 12, wherein the data structure returns a rate of change in battery degradation ($dX_{EB}/dt$), the rate of change in battery degradation ($dX_{EB}/dt$) is integrated over a time-step (t) to return an actual change in battery degradation ($\Delta X_{EB(t)}$), and the actual change in battery degradation ($\Delta X_{EB(t)}$) is added to a running total that keeps track of the change in battery degradation ($\Delta X_{EB(overall)}$) to arrive at the event-based output in step (c).

14. A method for estimating battery degradation in a vehicle battery pack, comprising the steps of:
(a) receiving one or more battery conditions at a battery control module;
(b) providing the one or more battery conditions to an event-based sub-routine and excecuting the event-based sub-routine with the battery control module, wherein the event-based sub-routine comprises the steps of:
  i) evaluating the battery conditions and identifying a state-of-charge (SOC) extremity and an SOC breakthrough;
  ii) using the SOC extremity and the SOC breakthrough to determine an SOC swing ($\Delta SOC$); and
  iii) returning the SOC swing ($\Delta SOC$) as an event-based input;
(c) providing the event-based input to a data structure that correlates the event-based input to battery degradation and returns output that is used to form an event-based output that is representative of battery degradation; and
(d) using the event-based output from the event-based algorithm to estimate battery degradation in the vehicle battery pack.

15. The method of claim 14, wherein state-of-charge (SOC) readings are part of the battery conditions, and the state-of-charge (SOC) extremity corresponds to a peak or valley in state-of-charge (SOC) readings, and the state-of-charge (SOC) breakthrough corresponds to a point where state-of-charge (SOC) readings rise above or fall below a previously determined state-of-charge (SOC) extremity, but do so without creating a new state-of-charge (SOC) extremity.

16. The method of claim 14, wherein step (b)(ii) further comprises determining the SOC swing ($\Delta SOC$) according to a last-in-first-out (LIFO) process.

17. The method of claim 14, wherein step (b)(ii) further comprises determining an SOC swing ($\Delta SOC$) and an SOC maximum ($SOC_{Max}$), and step (b)(iii) further comprises returning the SOC swing ($\Delta SOC$) and the SOC maximum ($SOC_{Max}$) as event-based input each time an SOC breakthrough is detected.

18. The method of claim 17, wherein step (b)(iii) further comprises returning a temperature reading (T) with the SOC swing ($\Delta SOC$) and the SOC maximum ($SOC_{Max}$) as event-based input.

19. The method of claim 14, wherein step (c) further comprises providing the event-based input to a data structure that returns a rate of change in battery degradation ($dX_{EB}/dt$), the rate of change in battery degradation ($dX_{EB}/dt$) is integrated over a time-step (t) to return an actual change in battery degradation ($\Delta X_{EB(t)}$), and the actual change in battery degradation ($\Delta X_{EB(t)}$) is added to a running total that keeps track of the change in battery degradation ($\Delta X_{EB(overall)}$) to arrive at the event-based output in step (c).

* * * * *